United States Patent
Ho et al.

(10) Patent No.: US 7,078,272 B2
(45) Date of Patent: Jul. 18, 2006

(54) WAFER SCALE INTEGRATION PACKAGING AND METHOD OF MAKING AND USING THE SAME

(75) Inventors: Chi-Shen Ho, Fremont, CA (US); Chang-Ming Lin, San Jose, CA (US)

(73) Assignee: Aptos Corporation, Milpitas, CA (US)

( * ) Notice: Subject to any disclaimer, the term of this patent is extended or adjusted under 35 U.S.C. 154(b) by 0 days.

(21) Appl. No.: 10/946,149

(22) Filed: Sep. 20, 2004

(65) Prior Publication Data

US 2006/0063311 A1    Mar. 23, 2006

(51) Int. Cl.
*H01L 21/44* (2006.01)
*H01L 21/48* (2006.01)
*H01L 21/50* (2006.01)

(52) U.S. Cl. .................. 438/127; 438/108; 438/907

(58) Field of Classification Search .............. 438/108, 438/112, 118, 119, 124, 127, 907, 909

See application file for complete search history.

(56) References Cited

U.S. PATENT DOCUMENTS 6,536,653 B1 * 3/2003 Wang et al. ............ 228/180.22
6,857,557 B1 * 2/2005 Hua ..................... 228/180.22

\* cited by examiner

*Primary Examiner*—Phuc T. Dang
(74) *Attorney, Agent, or Firm*—Tung & Associates

(57) ABSTRACT

A method of making a microelectronic device comprising: making a device B comprising providing a structure having a first bond pad, depositing a first electrically conductive material having a first reflow temperature over the first bond pad, and depositing a second electrically conductive material having a second reflow temperature over the first electrically conductive material, and wherein the second reflow temperature is less than the first reflow temperature, and heating the device to a temperature sufficient to reflow the second electrically conductive material but not the first electrically conductive material so that the second electrically conductive material encapsulates the first electrically conductive material to provide a first bump for making electrical connection to device B.

16 Claims, 4 Drawing Sheets

WAFER SCALE INTEGRATION PACKAGING AND METHOD OF MAKING AND USING THE SAME

FIELD OF THE INVENTION

This invention relates to semiconductor manufacturing processes utilizing flip chip bonding and redistribution layers.

BACKGROUND OF THE INVENTION

Potter et al. U.S. Pat. No. 6,444,563 discloses a method of making a ball grid array or chip scale package integrated circuit by first identifying the most unreliable solder ball joints on the integrated circuit. The worse case joints or joints in the vicinity of the worst case joints are changed in pad dimension and exposed to more ball/bump conductive material than the other more robust joints in the integrated circuit to create a ball on a larger pad that is larger than the normal size ball. The larger balls are formed by placing multiple smaller balls together on a single pad to form one large ball during a reflow operation. The larger ball improves the overall integrated circuit reliability by improving the reliability of the weakest joints in the integrated circuit design. The standoff of both the larger balls and the smaller balls are engineered to be substantially equal.

Stierman et al. U.S. Pat. No. 4,874,476 discloses a method of plating bumps on metallization on the face of a wafer, including the steps of placing the wafer in a transportable fixture wherein cathode needles press against the face of the wafer to make electrical contact and to force the backside of the wafer against a sealing member to prevent the plating bath from contacting the back side. The fixture with the wafer therein is placed in a cleanup or presoaked bath and is then transported to the plating bath without the operator having to touch the wafer. Stierman et al. recognized that when using TAB or flip chip technology, it is desirable that the bumps be tall, and further states the following. Studies involving computer stress modeling show that tall bumps give more stress relief and thus greater reliability than shorter bumps. The height of a well-formed bump is equal to the thickness of the photoresist on the face of the wafer. Since the depth of the via is equal to the thickness of the photoresist, it is apparent that deep vias produce tall bumps. The deep vias are more prone to trapping bubbles than are the shallower vias and the vias are on wafers being bump-plated by one of the prior art processes in which the wafers are either a vertical or face down orientation during plating.

SUMMARY OF THE INVENTION

A method of making a microelectronic device comprising: making a device B comprising providing a structure having a first bond pad, depositing a first electrically conductive material having a first reflow temperature over the first bond pad, and depositing a second electrically conductive material having a second reflow temperature over the first electrically conductive material, and wherein the second reflow temperature is less than the first reflow temperature, and heating the device B to a temperature sufficient to reflow the second electrically conductive material but not the first electrically conductive material so that the second electrically conductive material encapsulates the first electrically conductive material to provide a first bump.

These and other embodiments of the invention will be apparent from the following brief description of the drawings, detailed description of preferred embodiments, and appended claims and drawings.

DETAILED DESCRIPTION OF PREFERRED EMBODIMENTS

One embodiment of the invention includes a method of making tall electrical contact bumps, such as flip chip bumps. One embodiment of the invention includes depositing a first electrically conductive material over a bond pad. The first electrically conductive material has a first reflow temperature. A second electrically conductive material is deposited over the first electrically conductive material and has a second reflow temperature which is lower than the first reflow temperature of the first electrically conductive material. The device is heated to a temperature sufficient to reflow the second electrically conductive material but not sufficiently hot enough to reflow the first electrically conductive material and so that the second electrically conductive material encapsulates the first electrically conductive material. The result is a bump that is taller than a bump would be if both the first and second electrically conductive materials were reflown.

Figure 1A:
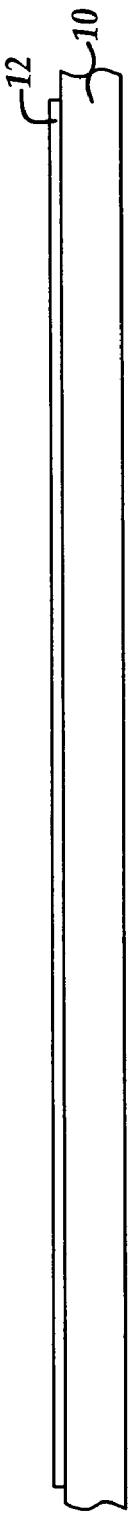
FIG. 1A illustrates one embodiment of a method according to the present invention including depositing a dielectric layer on a first substrate.

The following is a description of a detailed process that includes embodiments of the present invention. Referring now to FIG. 1A, a first substrate 10 is provided. The first substrate 10 may be a semiconductor comprising silicon and dopants, a ceramic substrate, a plastic substrate, a fiberglass substrate, or any other substrate known to those skilled in the art on which microelectronics structures may be deposited and/or formed. A first dielectric or insulation layer 12 is formed over the first substrate 10. The first dielectric layer 12 may be $SiO_2$, for example 5000 A, or polyimide, for example, 4.5 μm. A redistribution layer or trace 14 is selectively formed over the first dielectric layer 12. The redistribution trace 14 may be formed using techniques known to those skilled in the art. For example, an adhesion layer or under bump metallurgy (not shown) may be coated onto the first dielectric layer 12, for example, by using sputtering techniques. For example, a coating of Ti/Cu may be deposited in a thickness of about 1500–5000 A. Then a coating of photoresist material (not shown) may be deposited and developed over the adhesion or under bump metallurgy. A layer of copper may be deposited into openings selectively formed in the photoresist material, for example, by plating. Thereafter, the photoresist material is stripped and then the device is etched back to remove exposed and unplated areas of the adhesion layer or under bump metallurgy to form the redistribution trace 14 as illustrated in FIG. 1B.

Figure 1B:
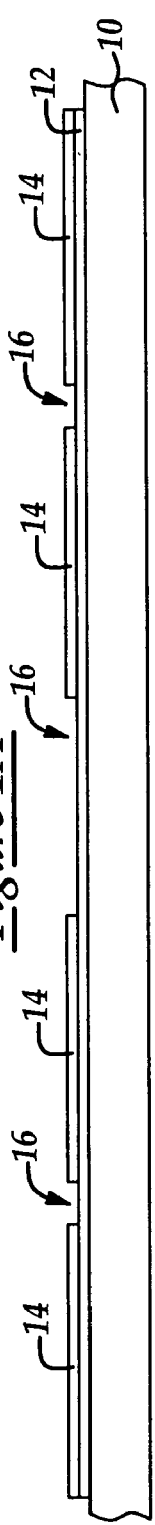
FIG. 1B illustrates another embodiment in a method according to the present invention including forming a redistribution trace selectively over the dielectric layer of FIG. 1A.
Figure 1C:
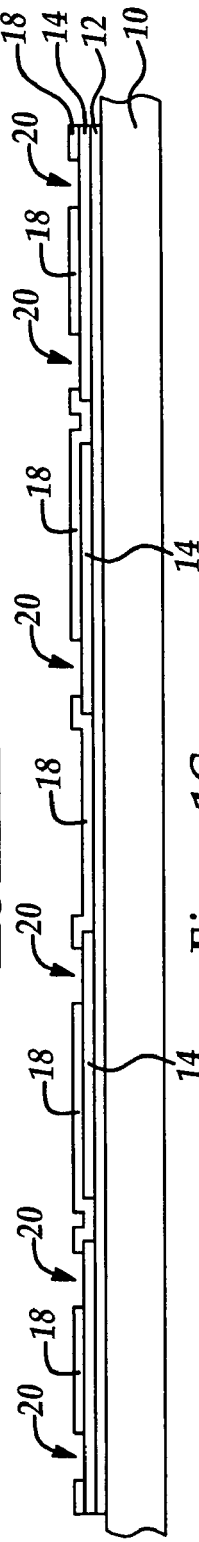
FIG. 1C illustrates one embodiment of a method according to the present invention including forming a second dielectric layer over portions of the redistribution trace of FIG. 1B.

Referring now to FIG. 1C, a second dielectric or insulation layer 18 is selectively formed over the structure of FIG. 1B. For example, a layer of polyimide or BCB may be deposited to a thickness of about 4.5 μm. This may be accomplished by depositing a blanket dielectric layer over the entire structure and selectively etching openings 20 at specific locations in the dielectric layer 18 using photoresist and etching techniques, laser techniques or similar process steps known to those skilled in the art to form an opening or via through a dielectric layer 18.

Figure 1D:
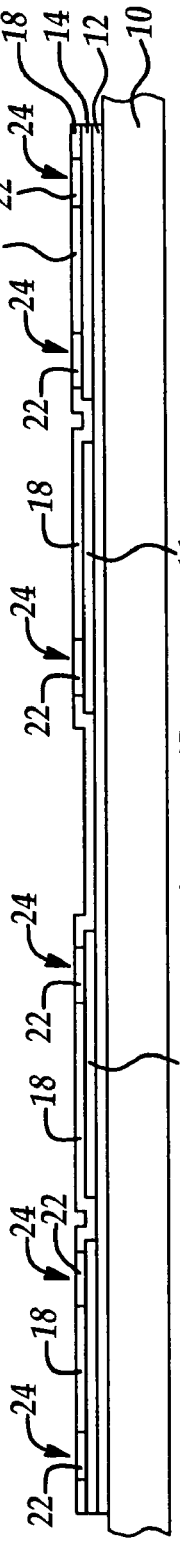
FIG. 1D illustrates one embodiment of a method according to the present invention including forming a bond pad in openings formed in the dielectric layer of FIG. 1C.

Referring now to FIG. 1D, one embodiment that the invention includes forming tin (Sn) 24 in the opening 20 formed in the second dielectric layer 18. This may be accomplished by emersion (electroless) tin plating to cover the vias with tin to approximately a thickness of about 2,000 angstroms to serve as the wettable surface for forming flip chip bonding and to prevent copper trace landing pad oxidation. Electroless plating uses a redox reaction to deposit metal on an object without the passage of current. Because electroless plating uses a metal ion concentration to bathe all parts of the object, it deposits metal evenly along edges, inside holes, and over irregularly shaped objects which are difficult to plate even with electroplating. Electroless plating involves the reduction of a complexed metal using a mild reducing agent, typically formaldehyde. Copper can be plated using a similar reaction, by reducing complexed copper with formaldehyde in an alkaline solution. The reaction may be catalyzed by palladium, which is deposited on the surface in extremely small amounts in a previous step. Nickel may also be plated using electroless plating. FIG. 1D illustrates a first device 100 (device A).

Figure 1E:
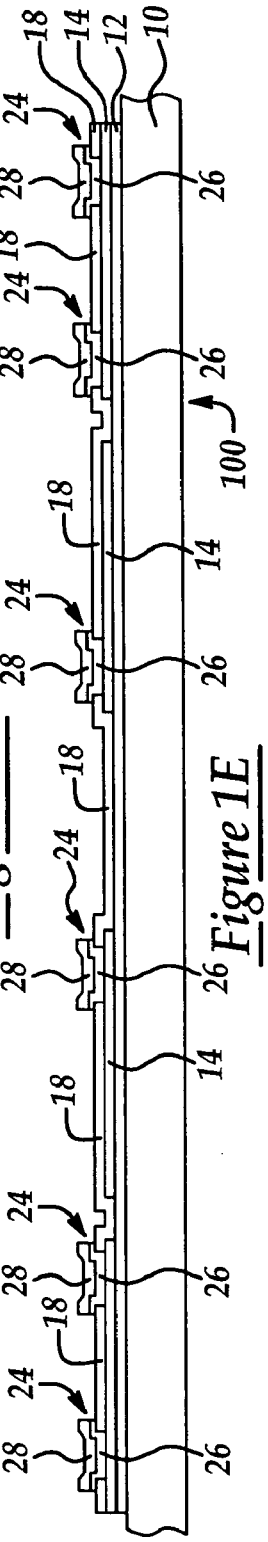
FIG. 1E illustrates an alternative to FIG. 1D as one embodiment of a method according to the present invention including forming a bond pad by electrolyte plating.

Referring now to FIG. 1E, as an alternative to the embodiment described with respect to FIG. 1D, a bond pad 24 may be formed in the opening 20 of the second dielectric layer 18. The bond pad 24 may include an under bump metallurgy 26 which is deposited over the device and down into the openings 20 in the second dielectric layer 18. An electrically conductive material 28, such as eutectic solder may be deposited over the under bump metallurgy and aligned with the openings 20 that were formed in the second dielectric layer 18. The eutectic solder may be deposited to any desirable thickness but preferably to a thickness of about 20 μm. This may be accomplished using photoresist-processing techniques which include selectively forming openings in a photoresist layer, wherein the openings are aligned with the openings in the second dielectric layer 18. After the eutectic solder 28 has been deposited in the openings of the photoresist layer, the photoresist layer is stripped and any exposed under bump metallurgy is etched away to leave a two part bond pad 24 consisting of the under bump metallurgy 26 and the solder 28 to provide an alternative first device 100' (device A').

Figure 2A:
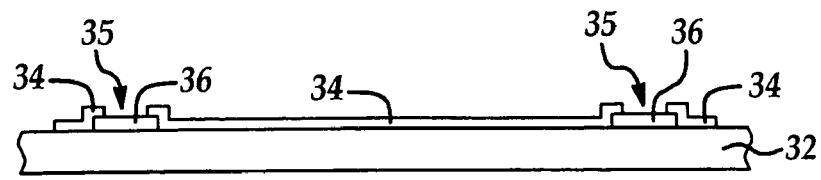
FIG. 2A illustrates one embodiment of a method of a method according to the present invention including providing a semiconductor wafer with bond pads thereon and a passivation layer with openings down to the bond pads.
Figure 2B:
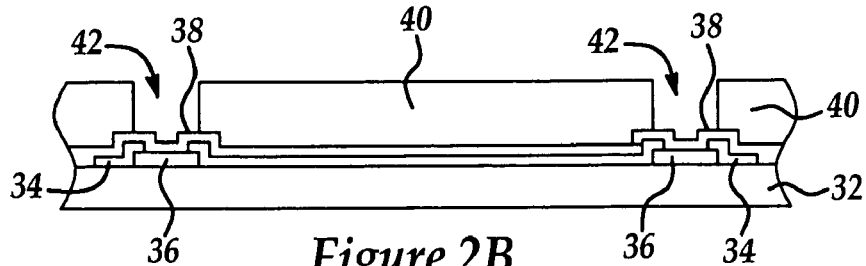
FIG. 2B illustrates one embodiment of a method according to the present invention including forming an under bump metallurgy over the structure of FIG. 2A and forming a photoresist layer with openings therein aligned with the bond pads.
Figure 2C:
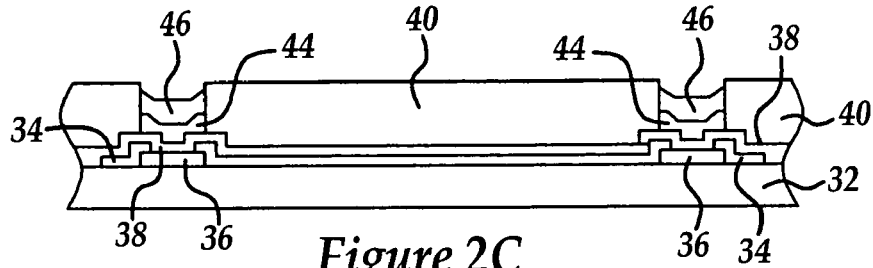
FIG. 2C illustrates one embodiment of a method according to the present invention including depositing a first electrically conductive material into the opening formed in the photoresist layer and depositing a second electrically conductive material over the first electrically conductive material.

Referring now to FIG. 2A-F, a microelectronic device with relatively tall electrically conductive bumps may be formed according to one embodiment of the invention. Referring now to FIG. 2A, one embodiment of the invention includes providing a second substrate 32. The second substrate 32 may be a semiconductor wafer with individual integrated circuits defined therein. The second substrate 32 may also be any type of substrate on which microelectronic features and structures may be formed and defined such as a ceramic substrate, plastic substrate, or a fiberglass substrate. A bond pad 36 may be formed on the second substrate 32 or made a part thereof and a passivation layer 34 may be formed over the second substrate 32 with openings defined therein exposing at least a portion of the bond pad 36. As show in FIG. 2B, an under bump metallurgy 38 may be deposited and a photoresist layer 40 may be deposited over the underbump metallurgy 38 and openings 42 formed in the photoresist layer 40 using photoresist techniques known to those skilled in the art. In one embodiment of the invention the photresist layer 40 may be deposited or formed to a thickness ranging from 50–125 μm, and preferably 60 μm. Each opening 42 is aligned with a bond pad 36 on the second substrate 32. As show on FIG. 2C, a first electrically conductive material 44 is deposited into the opening 42 formed in the photoresist layer 40 to provide a first substructure having a top face 102 and at least one side face 104. The first electrically conductive material 44 has a first reflow temperature. In one embodiment, the first electrically conductive material 44 includes copper. In one embodiment the first electrically conductive material may be deposited to a thickness ranging from 5–25 μm, and preferably 10 μm.

After the first electrically conductive material 44 has been deposited in the opening 42 in the photresist layer 40, a second electrically conductive material 46 is deposited on top of the first electrically conductive material 44 (the first substructure). A second electrically conductive material 46 has a second reflow temperature that is less than the first reflow temperature of the first electrically conductive material 44. In one embodiment, the second electrically conductive material 46 includes solder. In one embodiment the second electrically conductive material 46 may be deposited to a thickness ranging from 50–100 µm, and preferably 70 µm to provide a second substructure.

Figure 2D:
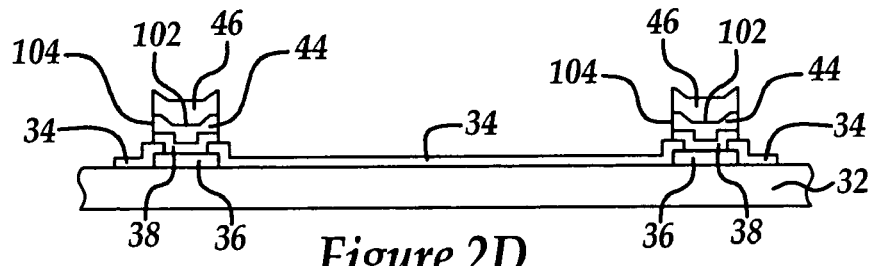
FIG. 2D illustrates one embodiment of a method according to the present invention including removing the photoresist layer of FIG. 2C and removing any exposed under bump metallurgy.
Figure 2E:
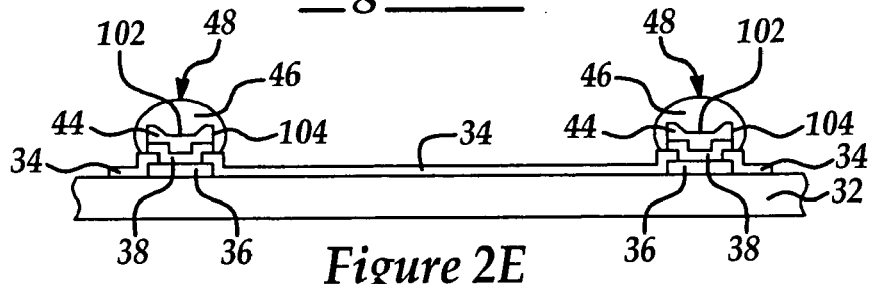
FIG. 2E illustrates one embodiment of a method according to the present invention including reflowing the second electrically conductive material.
Figure 2F:
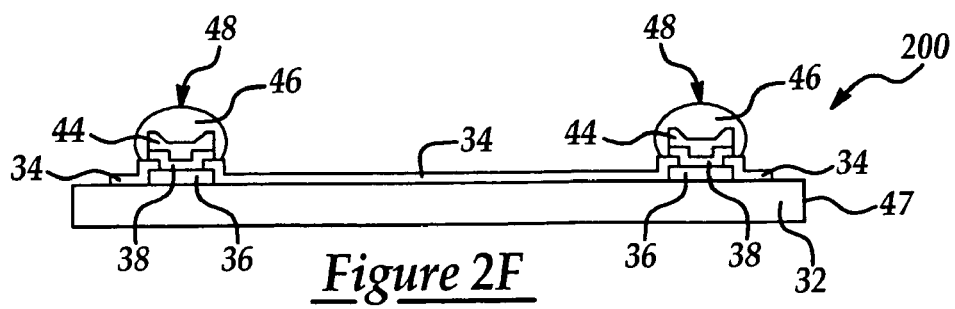
FIG. 2F illustrates one embodiment of a method according to the present invention including dicing the semiconductor wafer to provide individual flip chips.

As shown in FIG. 2D, the photoresist layer 40 is then stripped and any exposed under bump metallurgy portion 38 which is not masked by the first electrically conductive material 44 or the second electrically conductive material 46 is etched away. As shown in FIG. 2E, the device is then heated to a temperature sufficient to reflow the second electrically conductive material 46 but without reflowing the first electrically conductive material 44. The second electrically conductive material 46 may now encapsulate the first electrically conductive material 44. For example, the second electrically conductive material 46 may cover the top face 102 and the side face 104, and optionally over a portion of the first dielectric layer 34. The second electrically conductive material 46 may also enclose the remaining under bump metallurgy 38 that overlies the bond pad 36. The resulting structure 48 on the second device 200 (device B) is a tall bump which is taller than a structure that would result if the device is heated to a temperature sufficient to reflow both the first electrically conductive material 44 and the second electrically conductive material 46. After the second electrically conductive material 46 has been reflown, as shown in FIG. 2F, the semiconductor wafer 32 or other substrate may be diced (cut) into individual structures, such as individual flip chips, with tall bumps 48.

Figure 3A:
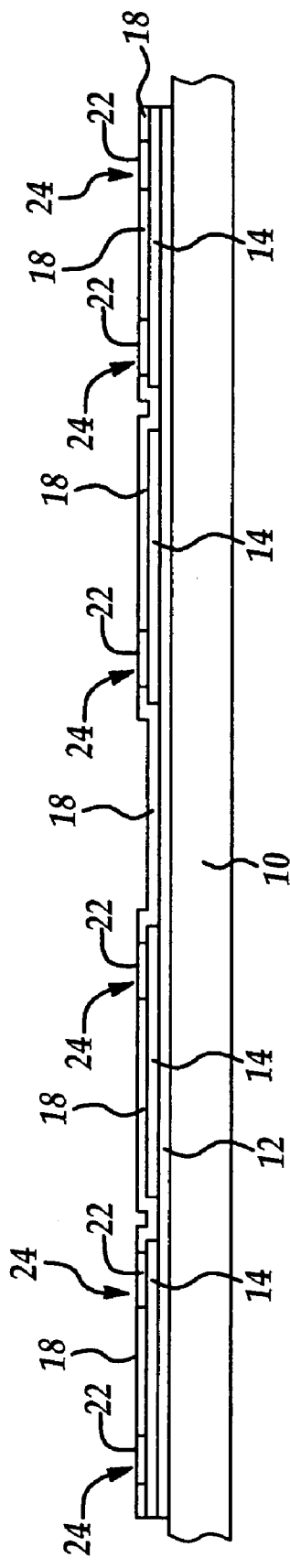
FIG. 3A illustrates one embodiment of a method according to the present invention providing a semiconductor wafer with redistribution traces and bond pads thereon.
Figure 3B:
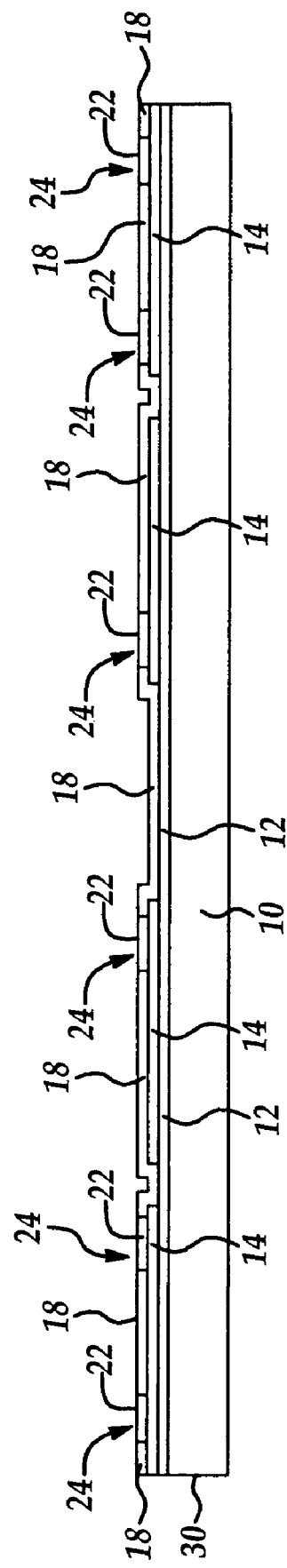
FIG. 3B illustrates one embodiment of a method according to the present invention including dicing the semiconductor wafer of FIG. 3A.
Figure 3C:
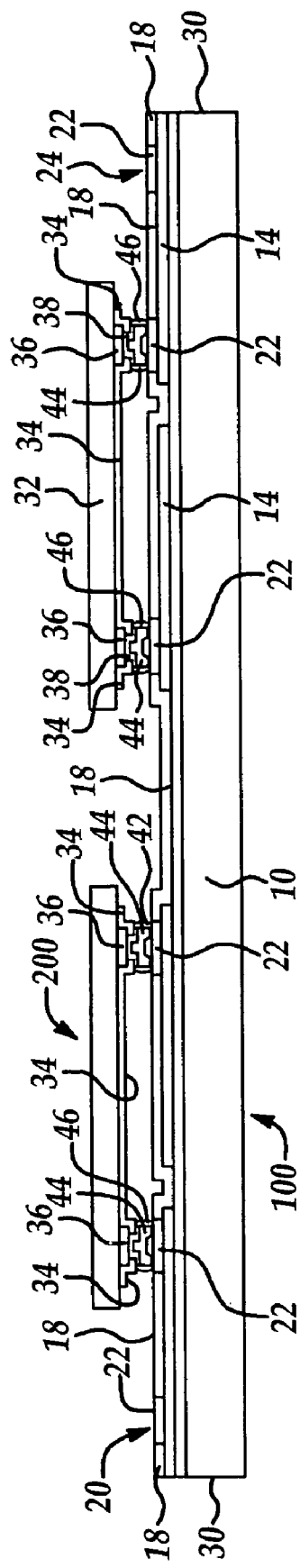
FIG. 3C illustrates one embodiment of a method according to the present invention including placing individual flip chips such as that illustrated in FIG. 2F and attaching same to the bond pads of the individualized substrates shown in FIG. 3B.
Figure 3D:
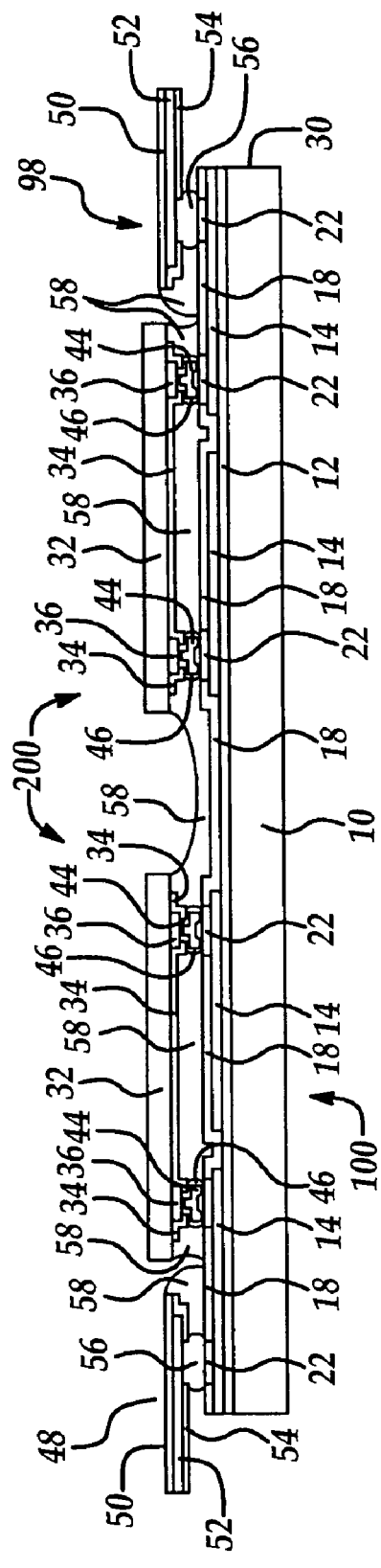
FIG. 3D illustrates one embodiment of a method according to the present invention including providing an underfill underneath the individual flip chips of FIG. 3C and attaching a flexible printed circuit including electrical contacts such as solder balls to bond pads of the device illustrated in FIG. 3C.

Referring now to FIG. 3A, which is substantially similar to FIG. 1B, or in the alternative may be the same as FIG. 1E. The following attachment of the individual flip chips may be accomplished utilizing a wafer structure such as that illustrated in 3A or in the alternative, individual sections of the wafer may be diced or cut as shown in FIG. 3B and thereafter the flip chips of FIG. 2F may be attached as shown in FIG. 3C. This may be accomplished by aligning the tall bumps 48 with bond pads 22 on the first substrate 10. Thereafter, the devices 100, (100'), and/or 200 may be heated to reflow the second electrically conductive material 46 of the bump without reflowing the first material 44 of the bump. As shown in FIG. 3D, additional structures may be added to the assembly such as a flexible printed circuit 98 which may include a base flexible layer 50 which may comprise a layer of polyimide and an electrical trace(s) 52 formed on the base layer 50. A cap layer 54 may also be a layer of polyimide which covers the electrical trace(s) 52. An electrically conductive contact 56 such as a solder bump may be attached to the electrical trace 52 and to a bond pad 22 of the first device 100. Underfill material 58 may be provided to fill the gap between the flip chip including the first substrate 32 and the first device 100 including the first substrate 10. Likewise, an underfill material 58 may be provided to encapsulate exposed portions of electrical contacts of the flexible printed circuit 98. The flexible printed circuit 98 may serve as an input/output port for the assembly.

As described above, one embodiment of the invention involves making and utilizing flip chips. The flip chip may be made using the following additional techniques known to those skilled in the art. Flip chips are typically made by a process including placing solder bumps on a silicon wafer. The solder bump flip chip processing typically includes four sequential steps: 1) preparing the wafer for solder bumping; 2) forming or placing the solder bumps on the wafer; 3) attaching the solder bumped die to a board, substrate or carrier; and 4) completing the assembly with an adhesive underfill.

The first step in a typical solder bumping process involves preparing the semiconductor wafer bumping sites on bond pads of the individual integrated circuits defined in the semiconductor wafer. The preparation may include cleaning, removing insulating oxides, and preparing a pad metallurgy that will protect the integrated circuits while making good mechanical and electrical contact with the solder bump. Accordingly, protective metallurgy layers may be provided over the bond pad. Ball limiting metallurgy (BLM) or under bump metallurgy (UBM) generally consists of successive layers of metal. The "adhesion" layer must adhere well to both the bond pad metal and the surrounding passivation, provide a strong, low-stress mechanical and electrical connection. The "diffusion barrier" layer prevents the diffusion of solder into the underlying material. The "solder wettable" layer provides a wettable surface for the molten solder during the solder bumping process, for good bonding of the solder to the underlying metal.

A variety of UBM structures are known to those skilled in the art that accomplish the above functions and have one, two, three or more layers depending on whether the bump is gold, copper, aluminum, solder or nickel based. For gold based bumps, known UBM structure include layers of Cr—Cu, Ti—Pd, Ti—W, or Ti—Pt. For copper based bumps, known UBM structures also include layers of Cr—Cu, or Al—Ni. For aluminum based bumps, known UBM structure include layers of Ti or Cr. For solder based bumps, known UBM structures include layers of Cr—Cu—Au, Ni—Cu, Ti—Cu, TiW—Cu, Ni—Au, or Al—NiV—Cu. For nickel based bumps, known UBM structure include layers of nickel. The UBM layers may be deposited by electroplating, evaporation, printing, electroless plating, and/or sputtering. It is also known to deposit one or more seed layers over the UBM structure prior to depositing the electrically conductive material (such as solder) that forms the bump.

Both of the first and second substructures made from either the first electrically conductive material 44 or the second electrically conductive material 46 may be form using any of a variety of techniques known to those skilled in the art including, but not limited to, evaporation, electroplating, electroless plating, screen-printing, ink jet printing, and micro-punching methods. The first electrically conductive material may also include an electrically conductive resin or composite.

When the terms "overlying", "overlie", "over" and the like terms are used regarding the position of one component of the invention with respect to another component of the invention, such shall mean that the first component may be in direct contact with the second component or that additional components such as under bump metallurgies, seed layers and the like may be interposed between the first component and the second component.

We claim:

1. A method of making a microelectronic device comprising:

making a device B comprising providing a structure having a first bond pad, depositing and patterning a photoresist layer over the device B and wherein an opening is provided in the photoresist layer aligned with the first bond pad, depositing a first electrically conductive material having a first reflow temperature into the opening in the photoresist layer and over the first bond pad, and depositing a second electrically conductive material having a second reflow temperature by a method comprises electroplating into the opening in the photoresist layer and over the first electrically conductive material, and wherein the second reflow temperature is less than the first reflow temperature, removing the photoresist layer and heating the device B to a temperature sufficient to reflow the second electrically conductive material but not the first electrically conductive material so that the second electrically conductive material encapsulates the first electrically conductive material to provide a first bump for making an electrical connection to device B.

2. A method as set forth in claim 1 wherein the first electrically conductive material comprises copper.

3. A method as set forth in claim 1 wherein the depositing of the second electrically conductive material having a first reflow temperature into the opening in the photoresist layer and over the first bond pad comprises electroplating the first electrically conductive material into the opening in the photoresist layer.

4. A method as set forth in claim 3 wherein the second electrically conductive material comprises solder.

5. A method as set forth in claim 1 wherein the device B comprises a substrate comprising at least one of silicon, ceramic, fiberglass, and plastic material.

6. A method as set forth in claim 1 wherein the first electrically conductive material is deposited to a thickness ranging from 5–25 μm.

7. A method as set forth in claim 1 wherein the second electrically conductive material is deposited to a thickness ranging from 50–100 μm.

8. A method of making a microelectronic device as set forth in claim 3 further comprising attaching the device B to a device A, and wherein the device A includes a plurality of bond pads, and contacting the first bump of the device B with an associated bond pad on the device A and the reflowing the first electrically conductive material and cooling the same so that the device B is attached to the device A.

9. A method as set forth in claim 8 wherein the device A comprises a substrate comprising at least one of silicon, ceramic, fiberglass, and plastic material.

10. A method as set forth in claim 8 wherein the device A comprises a substrate and further comprising forming the plurality of bond pads of device A by electroless plating tin over device A.

11. A method as set forth in claim 8 wherein the device A comprises a substrate and further comprising forming the plurality of bond pads of device A by electroplating solder over device A.

12. A method of making a microelectronic device comprising:

making a first device comprising providing a first silicon wafer having a first bond pad formed thereon and a first dielectric layer over the first substrate and a portion of the first bond pad, the first dielectric layer having an opening aligned with and exposing a portion of the first bond pad;

forming a redistribution trace over the first dielectric layer;

depositing a second dielectric over the first device including the redistribution layer;

etching openings in the second dielectric layer;

forming a bond pad in each opening in the second dielectric layer;

making a second device comprising providing a second silicon wafer having a bond pad formed thereon and a passivation layer over the wafer and a portion of each bond pad, and wherein openings are provided in the passivation layer and wherein the openings in the passivation layer each exposes a portion of one of the bond pads of the second device;

depositing an under bump metallurgy over the second device;

depositing a photoresist layer over the under bump metallurgy and patterning the photoresist layer to provide an opening aligned with each bond pad of the second device;

electroplating a first electrically conductive material into the opening in the photoresist layer over the under bump metallurgy, and wherein the first electrically conductive material has a first reflow temperature;

electroplating a second electrically conductive material into the opening in the photoresist layer that overlies the under bump metallurgy and over the first electrically conductive material, and wherein the second electrically conductive material has a second reflow temperature that is less than the first reflow temperature;

removing the photoresist layer over the under bump metallurgy and etching back any exposed under bump metallurgy;

heating the second device to a temperature sufficient to reflow the second electrically conductive material but not to reflow the first electrically conductive material and so that the second electrically conductive material encapsulates the first electrically conductive material, and cooling the second device to form an electrical contact bump comprising the first and second electrically conductive material;

contacting the contact bump of the second device with the first bond pad of the first device and reflowing the second electrically conductive material and cooling the same to attach the second device to the first.

13. A method as set forth in claim 8 wherein the first electrically conductive material comprises copper.

14. A method as set forth in claim 8 wherein the second electrically conductive material comprises solder.

15. A method as set forth in claim 12 wherein the first electrically conductive material is deposited to a thickness ranging from 5–25 μm.

16. A method as set forth in claim 12 wherein the second electrically conductive material is deposited to a thickness ranging from 50–100 μm.

* * * * *